US011280021B2

(12) United States Patent
Huang et al.

(10) Patent No.: US 11,280,021 B2
(45) Date of Patent: Mar. 22, 2022

(54) METHOD OF CONTROLLING CHEMICAL CONCENTRATION IN ELECTROLYTE AND SEMICONDUCTOR APPARATUS

(71) Applicant: TAIWAN SEMICONDUCTOR MANUFACTURING CO., LTD., Hsinchu (TW)

(72) Inventors: Yung-Chang Huang, Taichung (TW); You-Fu Chen, Yunlin County (TW); Yu-Chi Tsai, Hsinchu (TW); Chu-Ting Chang, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/277,945

(22) Filed: Feb. 15, 2019

(65) Prior Publication Data

US 2019/0323142 A1    Oct. 24, 2019

Related U.S. Application Data

(60) Provisional application No. 62/660,154, filed on Apr. 19, 2018.

(51) Int. Cl.
*C25D 21/18* (2006.01)
*H01L 21/288* (2006.01)
(Continued)

(52) U.S. Cl.
CPC ............... *C25D 21/18* (2013.01); *C25D 3/38* (2013.01); *C25D 7/12* (2013.01); *C25D 17/001* (2013.01);
(Continued)

(58) Field of Classification Search
CPC ...... C25D 21/04; C25D 17/002; C25D 21/08; F16K 24/04; F16K 3/0281; B65D 90/58–587; C23C 16/4412
See application file for complete search history.

(56) References Cited

U.S. PATENT DOCUMENTS 3,180,705 A * 4/1965 Freedman ................ C01G 7/00
                                                        423/29
3,895,137 A * 7/1975 Avramidis .......... C23C 18/1676
                                                       427/295
(Continued)

FOREIGN PATENT DOCUMENTS

CN       1166539 A     12/1997
CN     101842522 A      9/2010
(Continued)

OTHER PUBLICATIONS

Merriam Webster, Along (Year: 2016).*
(Continued)

*Primary Examiner* — Harry D Wilkins, III
*Assistant Examiner* — Ho-Sung Chung
(74) *Attorney, Agent, or Firm* — Maschoff Brennan

(57) ABSTRACT

A method of controlling chemical concentration in electrolyte includes measuring a chemical concentration in an electrolyte, wherein the electrolyte is contained in a tank; and increasing a vapor flux through an exhaust pipe connected to the tank when the measured chemical concentration is lower than a control lower limit value.

16 Claims, 13 Drawing Sheets

(51) Int. Cl.
*H01L 21/66* (2006.01)
*H01L 21/02* (2006.01)
*H01L 21/67* (2006.01)
*C25D 3/38* (2006.01)
*C25D 17/02* (2006.01)
*C25D 21/04* (2006.01)
*C25D 7/12* (2006.01)
*C25D 21/08* (2006.01)
*C25D 17/00* (2006.01)
*F16K 31/50* (2006.01)
*F16K 3/02* (2006.01)
*F16K 31/04* (2006.01)

(52) U.S. Cl.
CPC .............. *C25D 17/02* (2013.01); *C25D 21/04* (2013.01); *C25D 21/08* (2013.01); *F16K 3/0254* (2013.01); *F16K 3/0281* (2013.01); *F16K 31/04* (2013.01); *F16K 31/508* (2013.01); *H01L 21/02068* (2013.01); *H01L 21/2885* (2013.01); *H01L 21/6723* (2013.01); *H01L 21/67253* (2013.01); *H01L 22/26* (2013.01); *H01L 21/67167* (2013.01)

(56) References Cited

U.S. PATENT DOCUMENTS

| | | | |
|---|---|---|---|
| 5,295,907 A * | 3/1994 | Akkerman | ............ F16D 27/105 192/56.33 |
| 5,827,411 A | 10/1998 | Bishara et al. | |
| 5,853,559 A | 12/1998 | Tamaki et al. | |
| 5,858,196 A * | 1/1999 | Ikenaga | ............... C25D 21/14 205/82 |
| 2004/0195104 A1 | 10/2004 | Minato | |
| 2004/0226816 A1 * | 11/2004 | Yamamuro | ............ C25D 21/08 204/242 |
| 2006/0201814 A1 * | 9/2006 | Hafezi | ................... C25D 17/10 205/102 |
| 2007/0089990 A1 | 4/2007 | Behnke et al. | |
| 2010/0258436 A1 | 10/2010 | Takeuchi et al. | |
| 2010/0282710 A1 * | 11/2010 | Kitamura | ................. F16K 3/02 216/58 |
| 2015/0008119 A1 | 1/2015 | Papapanayiotou et al. | |
| 2015/0129418 A1 * | 5/2015 | Keigler | ................. C25D 21/10 204/237 |
| 2016/0149231 A1 | 5/2016 | Melman et al. | |
| 2017/0023145 A1 * | 1/2017 | Garrone | ............. F16K 37/0041 |
| 2018/0030611 A1 | 2/2018 | Spurlin et al. | |
| 2019/0035640 A1 * | 1/2019 | Thorkelsson | ....... H01L 21/6723 |

FOREIGN PATENT DOCUMENTS

| | | |
|---|---|---|
| CN | 203144531 U | 8/2013 |
| CN | 103866344 A | 6/2014 |
| CN | 104357901 A | 2/2015 |
| CN | 2015155918 U | 4/2016 |
| CN | 105624741 A | 6/2016 |
| CN | 106350845 A | 1/2017 |
| CN | 107287650 A | 10/2017 |
| CN | 107348830 A | 11/2017 |
| JP | S5696064 A | 8/1981 |
| JP | S59116364 A | 7/1984 |
| JP | 2006070349 A * | 3/2006 |
| TW | I300317 B | 8/2008 |
| TW | I480420 B | 4/2015 |

OTHER PUBLICATIONS

Guo-Sheng Peng et al., "Methods of Solving Chemistry Questions in Senior High Schools and Classification Analysis of Questions in College Entrance Examination" p. 79, Feb. 1994.

Xiao-Jian Ma et al., "Biochemical Engineering and Equipment" p. 187-188, Dec. 1996.

* cited by examiner

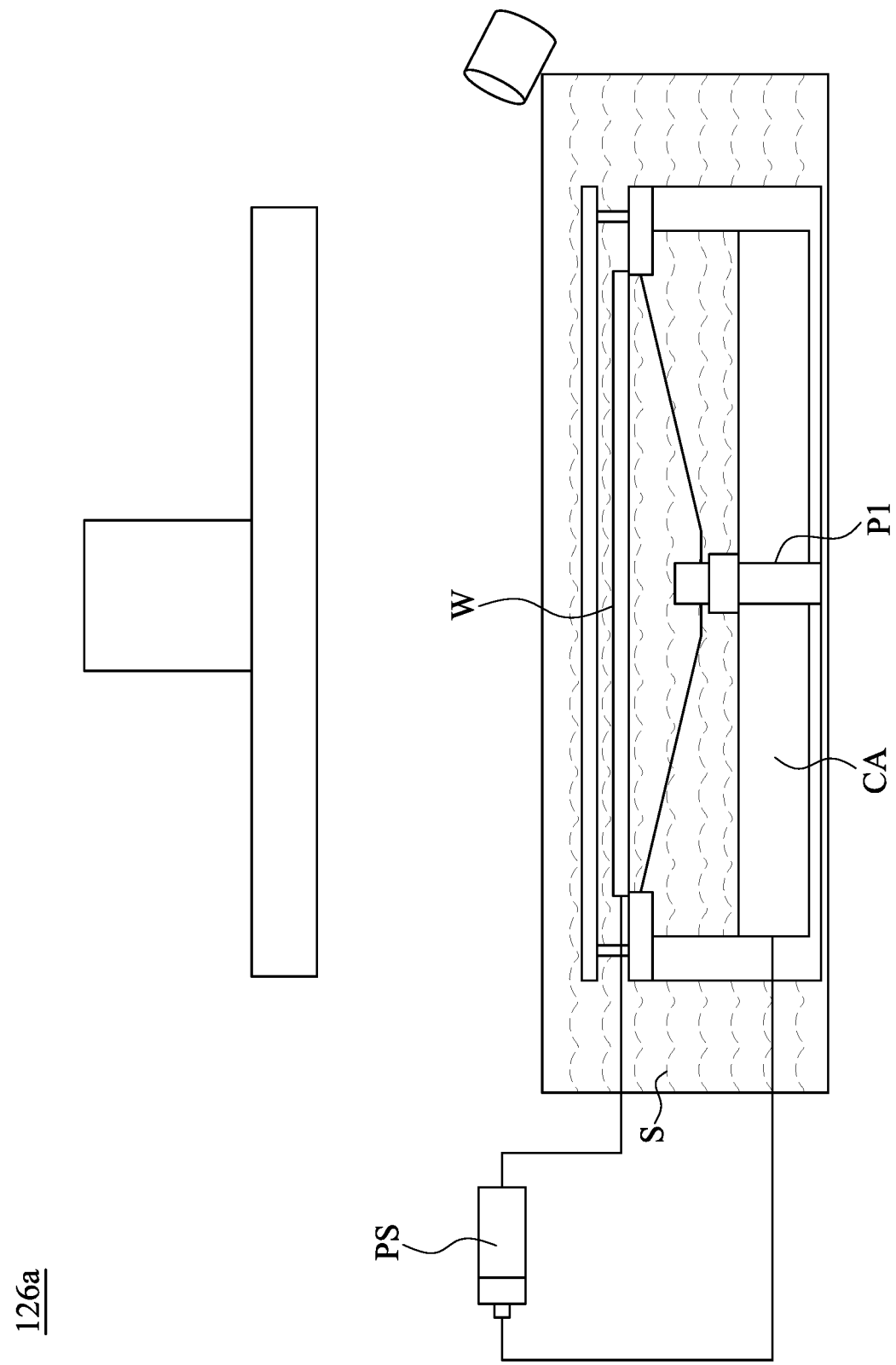

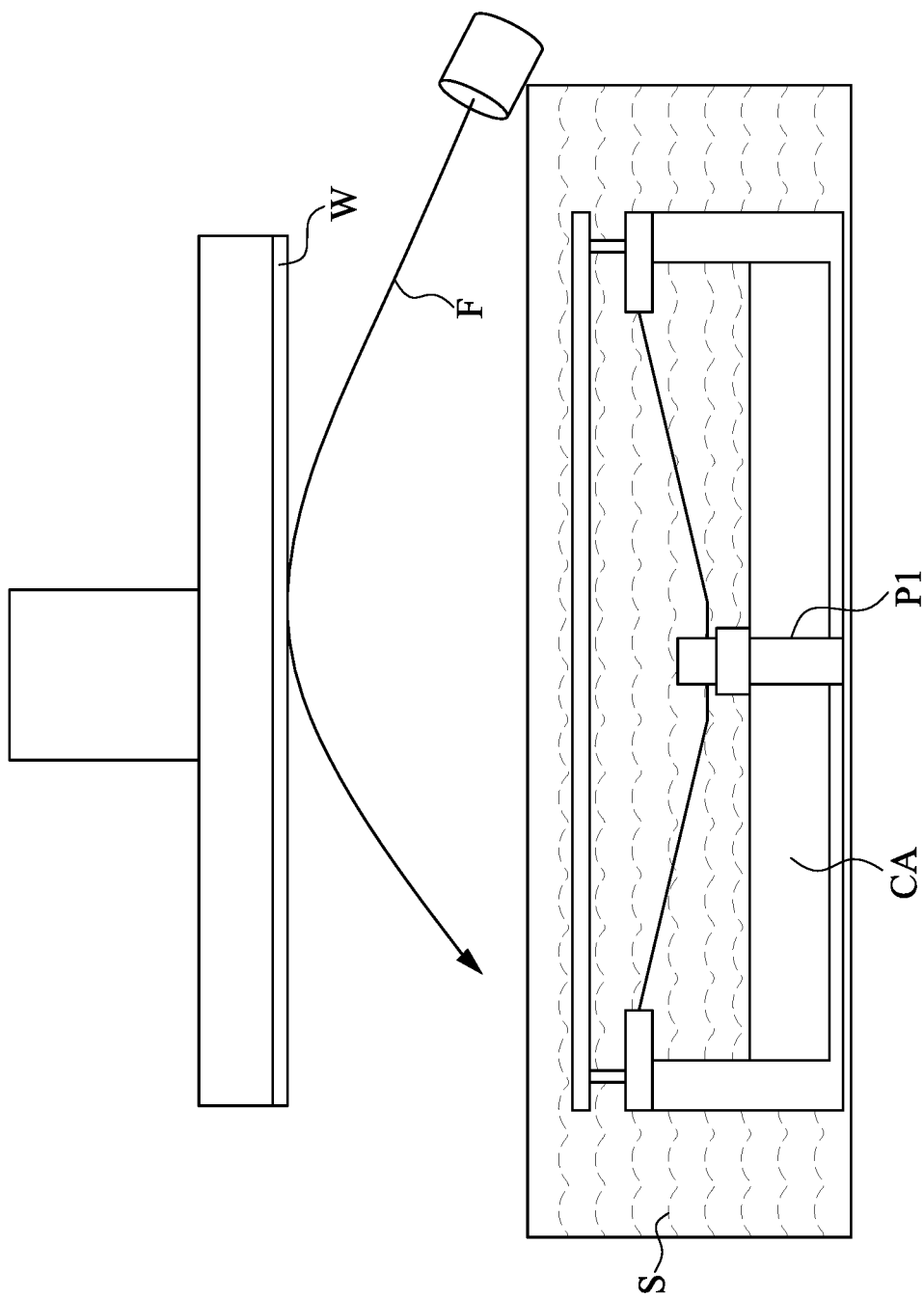

«METHOD OF CONTROLLING CHEMICAL CONCENTRATION IN ELECTROLYTE AND SEMICONDUCTOR APPARATUS»

PRIORITY CLAIM AND CROSS-REFERENCE

This application claims priority to U.S. Provisional Application Ser. No. 62/660,154, filed on Apr. 19, 2018, which is herein incorporated by reference in its entirety.

BACKGROUND

Conductive interconnections on integrated circuits typically take the form of trenches and vias in the background art. In modern deep submicron integrated circuits, the trenches and vias are typically formed by a damascene or dual damascene process. Copper is currently used in ultra large scale integration (ULSI) metallization as a replacement for aluminum due to its lower resistivity and better electromigration resistance. Electrochemical copper deposition (ECD) has been adopted as the standard damascene or dual damascene process because of larger grain size (good electromigration) and higher deposition rates. More particularly, electrochemical plating (ECP) is well suited for the formation of small embedded damascene feature metallization due to its ability to readily control growth of the electroplated film for bottom-up filling, and the superior electrical conductivity characteristics of the electroplated film.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B is a schematic view of a wafer in an electroplating cell of FIG. 3A during an ECP process;

FIG. 3C is a schematic view of the wafer in the electroplating cell of FIG. 3B during a rinsing process;

DETAILED DESCRIPTION

Figure 1:
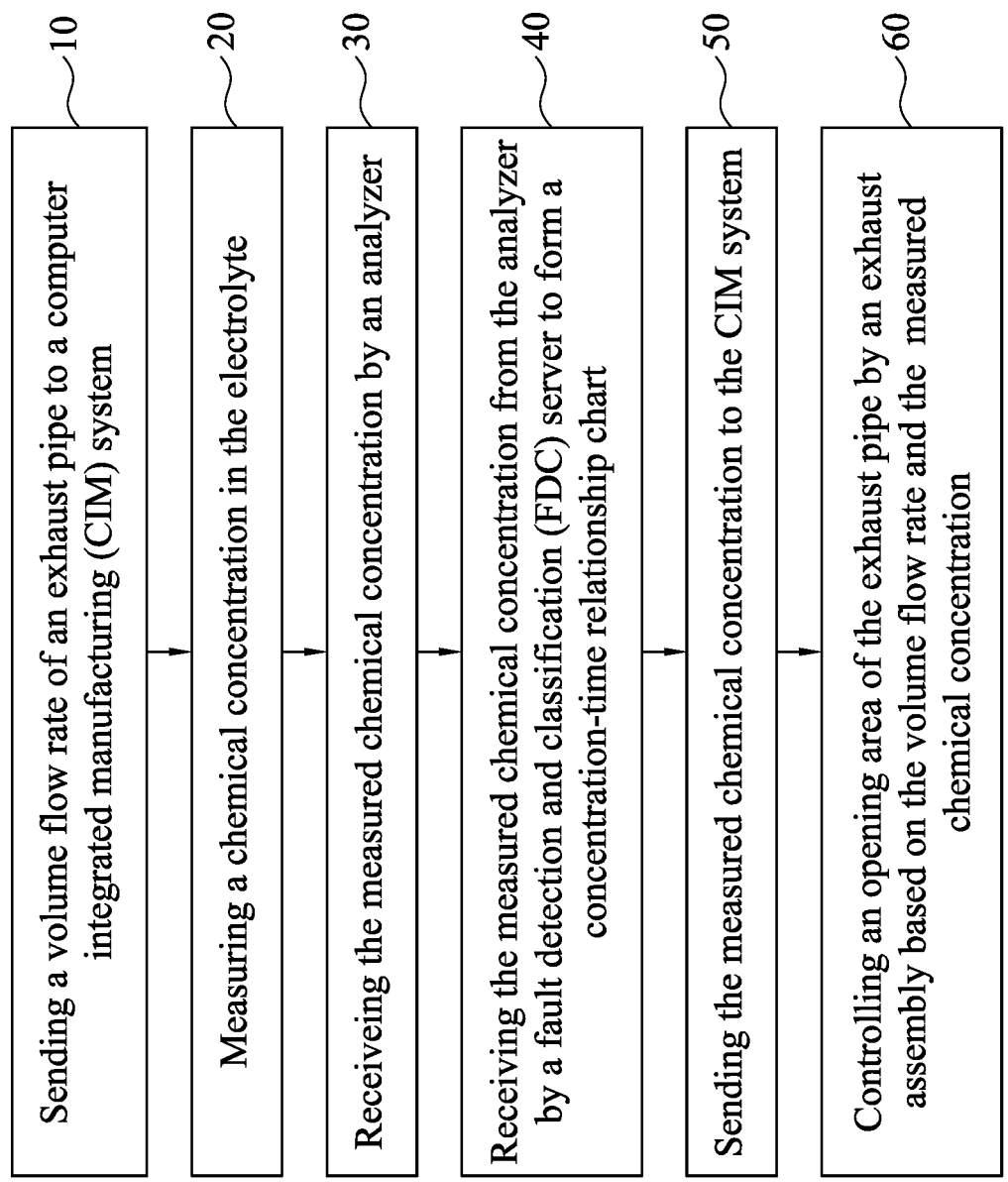
FIG. 1 is a flowchart of a method of controlling a chemical concentration in an electrolyte in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method of controlling a chemical concentration in an electrolyte in accordance with some embodiments of the present disclosure. The method begins with block 10 in which an exhaust assembly sends a volume flow rate of an exhaust pipe to a computer integrated manufacturing (CIM) system. The method continues with block 20 in which a prober measures a chemical concentration in the electrolyte. The method continues with block 30 in which an analyzer receives the measured chemical concentration from the prober. The method continues with block 40 in which a fault detection and classification (FDC) server receives the measured chemical concentration from the analyzer to form a concentration-time relationship chart. The method continues with block 50 in which the FDC server sends the measured chemical concentration to the CIM system. The method continues with block 60 in which the exhaust assembly controls an opening area of the exhaust pipe based on the volume flow rate of the exhaust pipe and the measured chemical concentration. While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2:
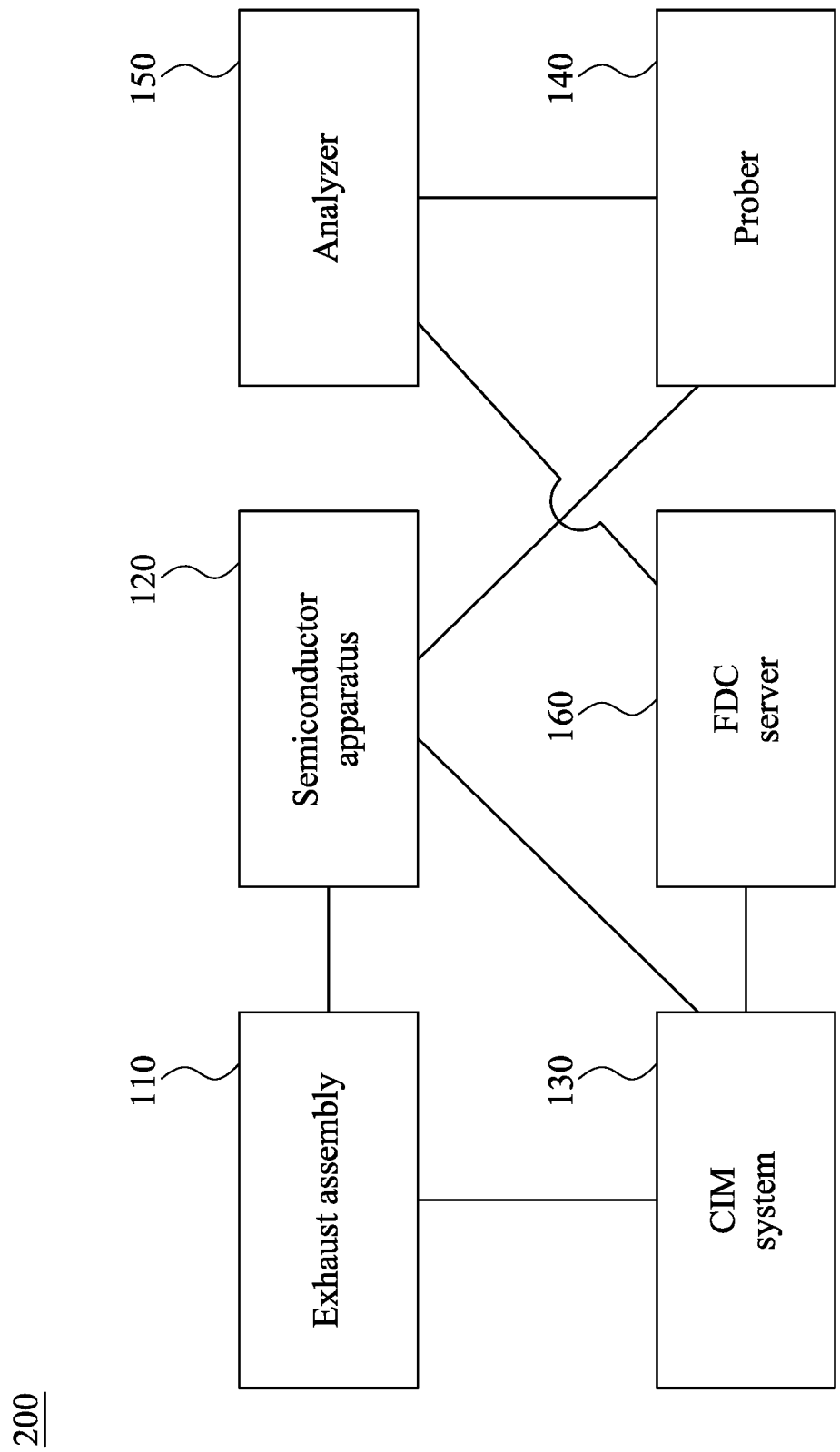
FIG. 2 is a block diagram of a semiconductor apparatus in accordance with some embodiments of the present disclosure.

FIG. 2 is a block diagram of a manufacturing system 200 in accordance with some embodiments of the present disclosure. The manufacturing system 200 includes the exhaust assembly 110, the semiconductor apparatus 120, the CIM system 130, the prober 140, the analyzer 150, and the FDC server 160. The exhaust assembly 110, the semiconductor apparatus 120, and the FDC server 160 are electrically connected to the CIM system 130. The semiconductor apparatus 120 is electrically connected to the exhaust assembly 110. The analyzer 150 is electrically connected to the prober 140. The FDC server 160 is electrically connected to the analyzer 150. In some embodiments, the analyzer 150 is a real-time analyzer (RTA). The FDC server 160 may include a data processor mechanism configured to process real-time data from the analyzer 150.

Figure 3A:
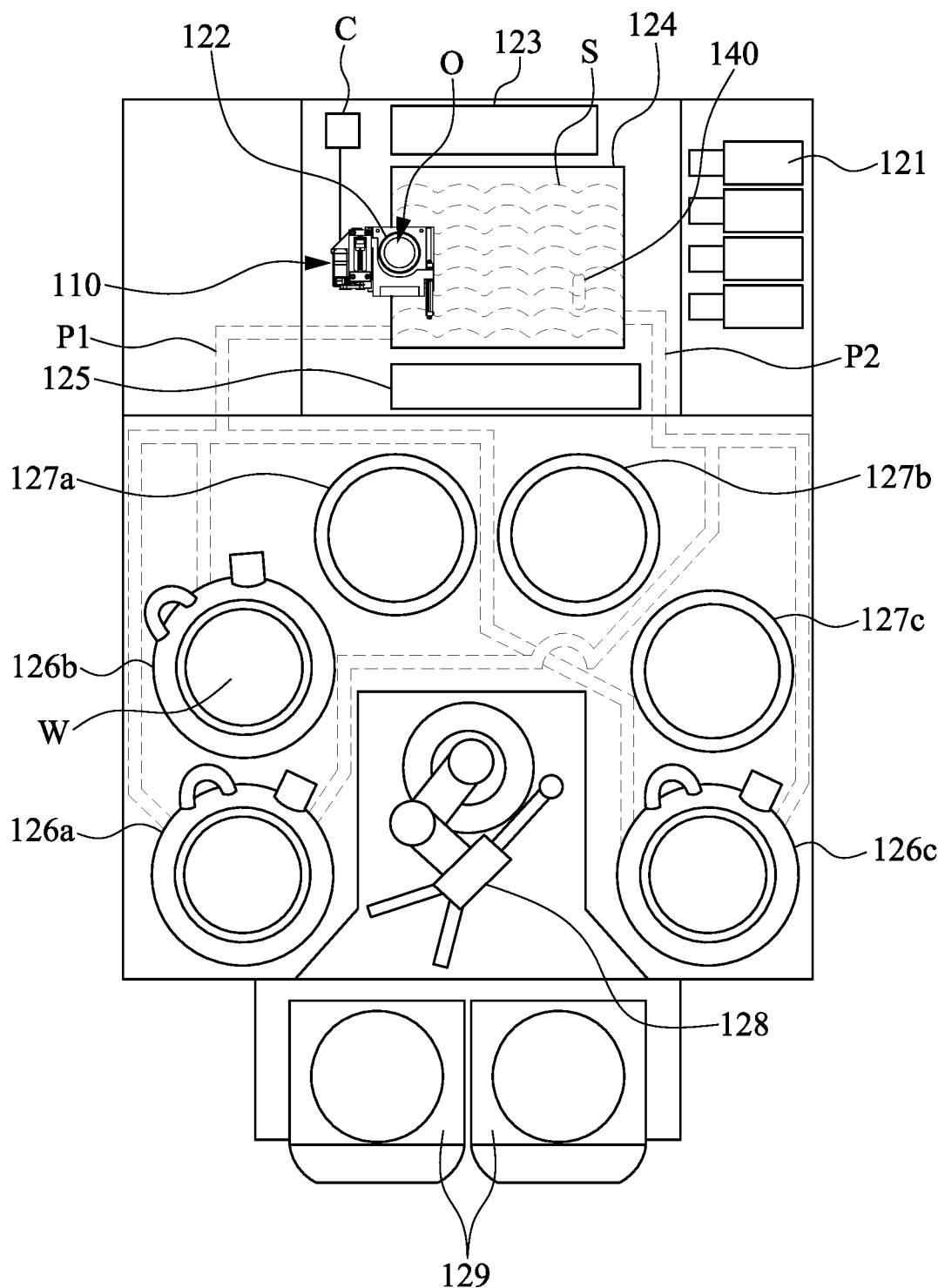
FIG. 3A is a top view of a semiconductor apparatus and an exhaust assembly of FIG. 2.

FIG. 3A is a top view of the semiconductor apparatus 120 and the exhaust assembly 110 of FIG. 2. The semiconductor apparatus 120 may be a cluster tool that has the capability to sequentially process substrates (e.g., semiconductor wafers W) in a controlled processing environment. The semiconductor apparatus 120 includes the exhaust pipe 122, a tank 124, and a controller C. The tank 124 contains a solution S therein, and a portion of the prober 140 of FIG. 2 is in the tank 124 to measure a chemical concentration in the solution S. The solution S is an electrolyte. In some embodiments, the electrolyte S includes water ($H_2O$), copper sulphate ($CuSO_4$), hydrochloric acid (HCl), sulfuric acid ($H_2SO_4$), and chemical additives, such as an accelerator (e.g., mercapto), a suppressor (e.g., polyethylene glycol (PEG)), a leveler (e.g., quaternary nitrogen), or the like. The exhaust pipe 122 is connected to the tank 124 and has an opening O above the electrolyte S. The opening O is at an end of the exhaust pipe 122 proximal to the tank 124. In the tank 124, vapor including water and crystalline acids may exist in an upper space of the tank 124 that is not occupied by the electrolyte S. The controller C is electrically connected to the exhaust assembly 110, and is configured to control the exhaust assembly 110 based on the measured chemical concentration. For example, when the measured chemical concentration is lower than a control lower limit value, the vapor flux through the exhaust pipe 122 is increased. When the measured chemical concentration is higher than a control upper limit value, the vapor flux through the exhaust pipe 122 is decreased.

Reference is made to FIGS. 2 and 3A. When the manufacturing system 200 of FIG. 2 is in operation, the exhaust assembly 110 sends a volume flow rate of the exhaust pipe 122 to the CIM system 130, and the prober 140 measures the chemical concentration in the electrolyte S. The analyzer 150 receives the measured chemical concentration from the prober 140. Thereafter, the FDC server 160 receives the measured chemical concentration from the analyzer 150 to form a concentration-time relationship chart, and sends the measured chemical concentration to the CIM system 130. The CIM system 130 determines an exhausting parameter value based on the volume flow rate of the exhaust pipe 122 and the measured chemical concentration through computation. The CIM system 130 combines the exhausting parameter value and a process recipe and sends them to the semiconductor apparatus 120 to control the exhaust assembly 110 based on the exhausting parameter value and the process recipe. In some embodiments, the exhausting parameter value includes the opening area of the exhaust pipe 122. For example, if the measured chemical concentration (e.g., copper concentration) is too low, the opening area of the exhaust pipe 122 is increased by the exhaust assembly 110 to increase the rate of piping the vapor out of the tank 124 and to lower the pressure in the tank 124. As a result, the speed of solvent evaporation from the electrolyte S is accelerated, such that the chemical concentration in the electrolyte S increases. On the other hand, if the measured chemical concentration is high enough or too high, the opening area of the exhaust pipe 122 is decreased by the exhaust assembly 110 to retain the vapor in the tank 124. As a result, the chemical concentration in the electrolyte S will not continuously increase for the reason of solvent evaporation from the electrolyte S.

The exhaust assembly 110 may operate in a mechanical manner, an electrical manner, an electromagnetic manner, or combinations thereof. For example, the exhaust assembly 110 may include a valve, a motor, a belt, and a ball screw (the aforementioned elements will be described in detail in FIG. 6). The valve is connected to the ball screw, and the belt is connected to the motor and the ball screw. The motor is electrically connected to the controller C of FIG. 3A. In some embodiments, the motor can be controlled by the controller C (i.e., in an electrical manner), and the valve can open, close, or partially open the opening O of exhaust pipe 122 through the motor, the belt, and the ball screw (i.e., in a mechanical manner). In alternative embodiments, the exhaust assembly 110 may include a valve to change the area of the opening O of exhaust pipe 122 using electromagnets (i.e., in an electromagnetic manner).

Reference is made to FIG. 3A. In some embodiments, the semiconductor apparatus 120 is an electrochemical plating (ECP) apparatus, which includes electroplating cells 126a, 126b, and 126c, a filtration and pumping device 121, a dosing device 123, and a chemical dilution module (CDM) 125. The tank 124 is a central bath of the ECP apparatus 120. Electrolyte pipes P1 and P2 connect the tank 124 and the electroplating cells 126a, 126b, and 126c. The tank 124 is configured to provide the electrolyte S to the electroplating cells 126a, 126b, and 126c through the electrolyte pipes P1, and to recycle the used electrolyte S from the electroplating cells 126a, 126b, and 126c to the tank 124 through the electrolyte pipes P2. The tank 124 is an atmosphere tank, which is disposed in a portion of the ECP apparatus 120 that is different from portions where the electroplating cells 126a, 126b, and 126c are. The electroplating cells 126a, 126b, and 126c are configured to electrofill metal (e.g., copper) on semiconductor substrates (e.g., silicon wafers W). The dosing device 123 is configured to store and deliver chemical additives for the electrolyte S. The tank 124 is configured to hold the electrolyte S used as an electroplating solution in the electroplating cells 126a, 126b, and 126c. The filtration and pumping device 121 is configured to filter the electrolyte S for the tank 124 and to pump the electrolyte S to the electroplating cells 126a, 126b, and 126c. The chemical dilution module 125 may store and mix chemicals to be an acid used in functional modules 127a, 127b, and 127c for edge bevel removal (EBR) and cleaning surfaces of wafers W.

FIG. 3B is a schematic view of a wafer W in the electroplating cell 126a of FIG. 3A during an ECP process. The other electroplating cells 126b and 126c of FIG. 3A are similar to the electroplating cell 126a of FIG. 3B. The electrolyte S in the electroplating cell 126a is provided by the tank 124 of FIG. 3A. In other words, the electrolyte S in the tank 124 of FIG. 3A is supplied to the electroplating cell 126a. One electrode (the anode) in the electrolyte S will undergo oxidation and the other (the cathode) will undergo reduction. In some embodiments, a copper anode CA is the anode, and the wafer W is the cathode. The metal of the copper anode CA will oxidize, going from an oxidation state (in the solid form) to a positive oxidation state and become an ion. At the wafer W, the metal ion in the electrolyte S will accept one or more electrons from the wafer W and the ion's oxidation state is reduced. This forms a solid metal (i.e., copper) that electrodeposits on the wafer W. As a result, the wafer W disposed in the electroplating cell 126a is electroplated to form interconnect features on the wafer W. The two electrodes are electrically connected to a power source PS, allowing for a flow of electrons that leave the copper anode CA and flow through this connection to the ions at the surface of the wafer W (cathode).

Referring to FIG. 3A and FIG. 3C, after the wafer W is electroplated, the wafer W is rinsed by de-ionized (DI) water F. The water F falls into the electrolyte S after rinsing the wafer W, thereby diluting the electrolyte S. The diluted electrolyte S is then recycled to the tank 124. As a result, after a number of wafers W, the chemical concentration (e.g., copper concentration) in the electrolyte S in the tank 124 will be decreased.

Reference is made to FIG. 3A. The exhaust assembly 110 is configured to adjustably exhaust the vapor above the electrolyte S in the tank 124 to maintain the chemical concentration (e.g., copper concentration) in the electrolyte S. In some embodiments, the chemical concentration (e.g., copper concentration) in the electrolyte S can be maintained in a suitable range by controlling the exhaust assembly 110, instead of dumping a fresh electrolyte solution into the tank 124 during preventive maintenance (PM). Since the chemical concentration (e.g., copper concentration) in the electrolyte S is maintained in a suitable range for the ECP process, the efficiency of filling holes with metal is stable, and voids are not formed in the metal. As a result, electrical property of the metal and product yield can be improved.

Moreover, in some embodiments, the semiconductor apparatus 120 may further include the functional modules 127a, 127b, and 127c, which may be configured to perform various process operations. For example, in some embodiments, one or more of the functional modules 127a, 127b, and 127c may be spin rinse drying (SRD) modules. In some embodiments, one or more of the functional modules 127a, 127b, and 127c may be post-electrofill modules (PEMs), each configured to perform a function, such as edge bevel removal (EBR), backside etching, and acid cleaning of substrates after they have been processed by one of the electroplating cells 126a, 126b, and 126c. In other words, after a wafer W is processed, either the module 127a, the module 127b, or the module 127c is configured to perform a desired operation, such as an EBR process, backside etching, and acid cleaning, upon the wafer W. Further, one or more of the modules 127a, 127b, and 127c may be pre-treatment chambers. The pre-treatment chamber may be a remote plasma chamber or an anneal chamber. Alternatively, a pre-treatment chamber may be included at another portion of the apparatus, or in a different apparatus. In addition, the semiconductor apparatus 120 includes a robot arm 128 and load ports 129. The robot arm 128 is configured to deliver substrates among the electroplating cells 126a, 126b, and 126c, the functional modules 127a, 127b, and 127c, and the load ports 129 in order to perform corresponding operations.

Figure 4:
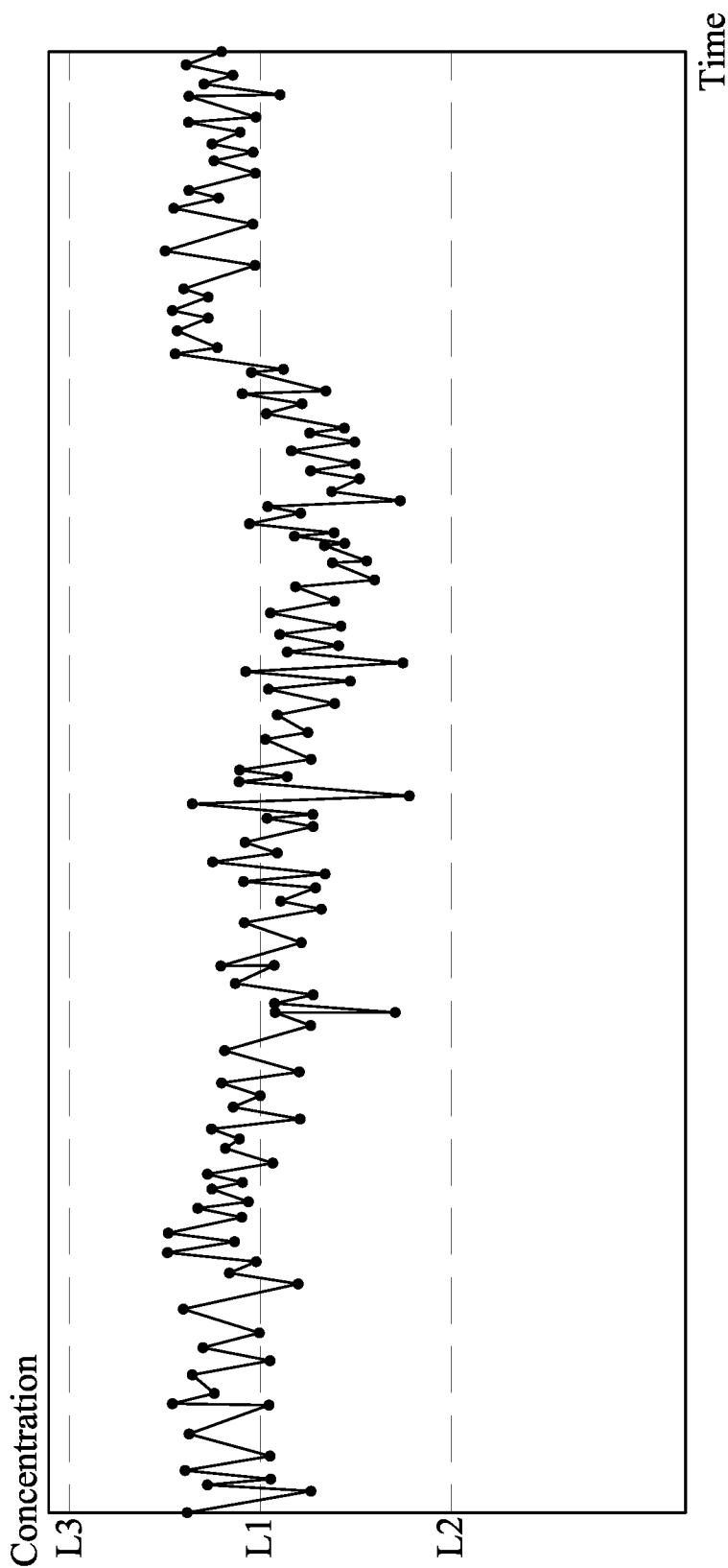
FIG. 4 is a concentration-time relationship chart presented by an fault detection and classification (FDC) server of FIG. 2.

FIG. 4 is a concentration-time relationship chart presented by the FDC server 160 of FIG. 2. The FDC server 160 (see FIG. 2) determines if the measured chemical concentration (e.g., copper concentration) is higher than or lower than a suitable range for the ECP process. For example, the dotted line L1 is a target value (i.e., baseline). In some embodiments, the target value may be in a range from about 2 g/L to about 70 g/L. When the target value is lower than about 2 g/L, poor filling efficiency for holes, electrical failures, and low yield may be prone to occur. When the target value is higher than about 70 g/L, voids in the electroplated metal, poor electrical property, and low yield may be prone to occur.

The dotted lines L2 and L3 respectively are an alarm lower limit value and an alarm upper limit value. If the measured chemical concentration is lower than the alarm lower limit value or higher than the alarm upper limit value, the FDC server 160 may send alarm information to the semiconductor apparatus 120 of FIG. 3A to stop further processing. In some embodiments, the alarm lower limit value may be in a range from about 94% to about 98% of the target value. When the alarm lower limit value is lower than about 94% of the target value, poor filling efficiency for holes, electrical property fail, and low yield may be prone to occur. When the alarm upper limit value is higher than about 98% of the target value, voids in the electroplated metal, poor electrical property, and low yield may be prone to occur. In some embodiments, the alarm upper limit value may be in a range from about 102% to about 106% of the target value. When the alarm upper limit value is lower than about 102% of the target value, poor filling efficiency for holes, electrical property fail, and low yield may be prone to occur. When the alarm upper limit value is higher than about 106% of the target value, voids in the electroplated metal, poor electrical property, and low yield may be prone to occur.

In some embodiments, when the measured chemical concentration is lower than a control lower limit value, the exhaust assembly 110 will start to increase the opening area of the exhaust pipe 122 (see FIG. 3A) to decrease the vapor in the tank 124, thereby increasing the chemical concentration in the electrolyte S. On the other hand, when the measured chemical concentration is higher a control upper limit value, the exhaust assembly 110 will start to decrease the opening area of the exhaust pipe 122, thereby decreasing the chemical concentration in the electrolyte S. In some embodiments, the control lower limit value may be in a range from about 97% to about 99% of the target value. When the control lower limit value is lower than about 97% of the target value, the chemical concentration in the electrolyte S may decrease to lower than the alarm lower limit value. When the control lower limit value is higher than about 99% of the target value, the chemical concentration in the electrolyte S may increase to higher than the alarm upper limit value. In some embodiments, the control upper limit value may be in a range from about 101% to about 103% of the target value. When the control upper limit value is lower than about 101% of the target value, the chemical concentration in the electrolyte S may decrease to lower than the alarm lower limit value. When the control upper limit value is higher than about 103% of the target value, the chemical concentration in the electrolyte S may increase to higher than the alarm upper limit value.

In some embodiments, evacuating the vapor is performed such that the chemical concentration in the electrolyte S can be sustained in a range from about 97% to about 103% of the target value. If the chemical concentration in the electrolyte S is lower than about 97% of the target value, poor filling efficiency for holes, electrical property fail, and low yield may be prone to occur. If the chemical concentration in the electrolyte S is higher than about 103% of the target value, voids in the electroplated metal, poor electrical property, and low yield may be prone to occur.

In some embodiments, a suitable opening area of the exhaust pipe 122 (see FIG. 3A) can be obtained by a computation result of the CIM system 130 (see FIG. 2)

based on the measured chemical concentration. Moreover, a proportional-integral-derivative (PID) algorithm may be used in the CIM system 130 or the FDC server 160 to figure out the desired opening area of the exhaust pipe 122 through a control loop feedback, such that the CIM system 130 can enable the exhaust assembly 110 to linearly adjust the opening area of the exhaust pipe 122 and the chemical concentration in the electrolyte S can be precisely controlled in a suitable range (e.g., from about 97% to about 103% of the target value).

Figure 5:
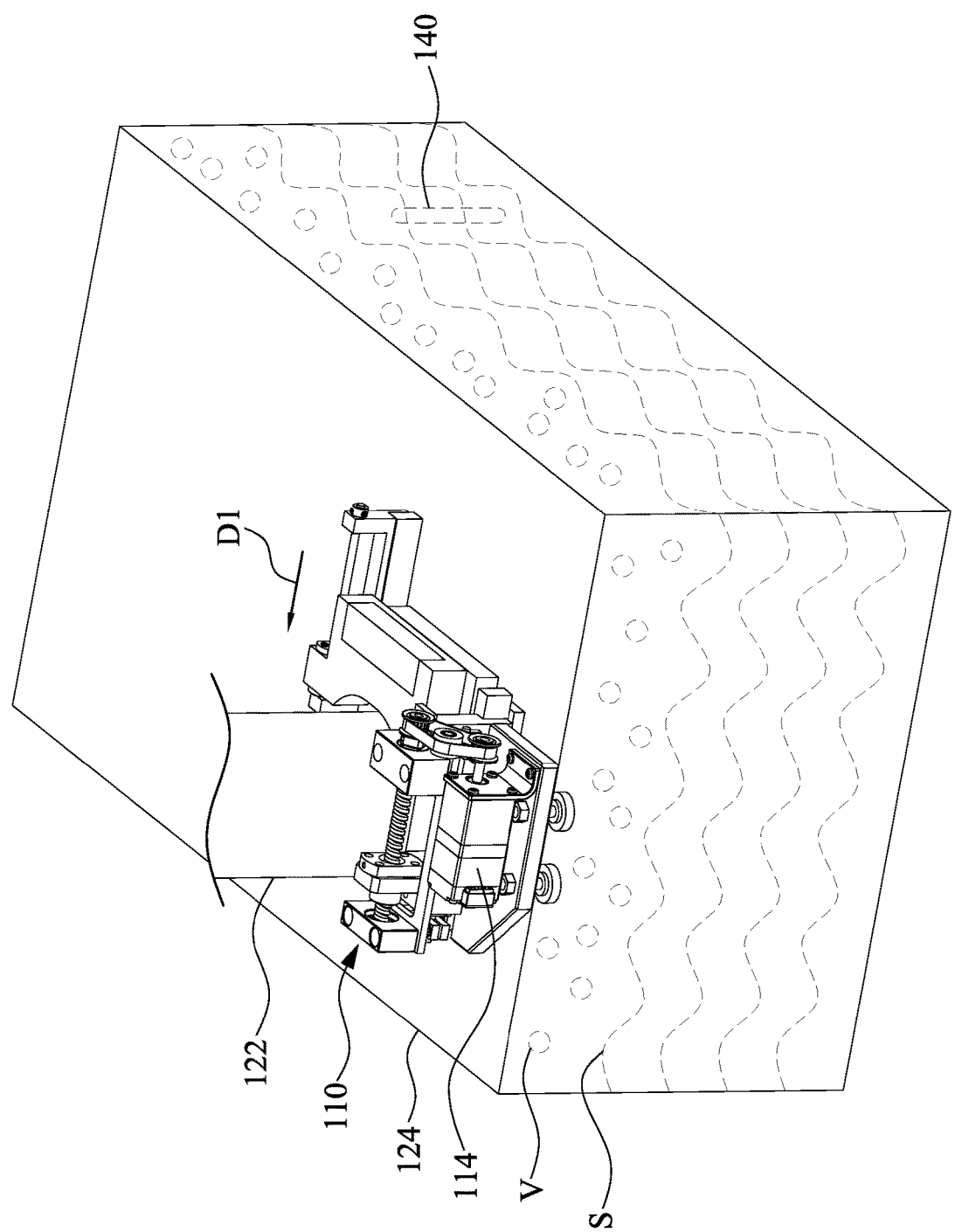
FIG. 5 is a perspective view of the exhaust assembly and a tank of FIG. 3A, in which the exhaust assembly is in a closed state.

FIG. 5 is a perspective view of the exhaust assembly 110 and the tank 124 of FIG. 3A, in which the exhaust assembly 110 is in a closed state. The closed state means the opening O of the exhaust pipe 122 (see FIG. 6) is closed by the exhaust assembly 110. The exhaust assembly 110 is located on the tank 124. The tank 124 contains the electrolyte S and the vapor V therein. The vapor V is above the electrolyte S and is in the upper space of the tank 124 that is not occupied by the electrolyte S. The exhaust assembly 110 may be programmed to control the vapor flux through the exhaust pipe 122 based on the measured chemical concentration.

Figure 6:
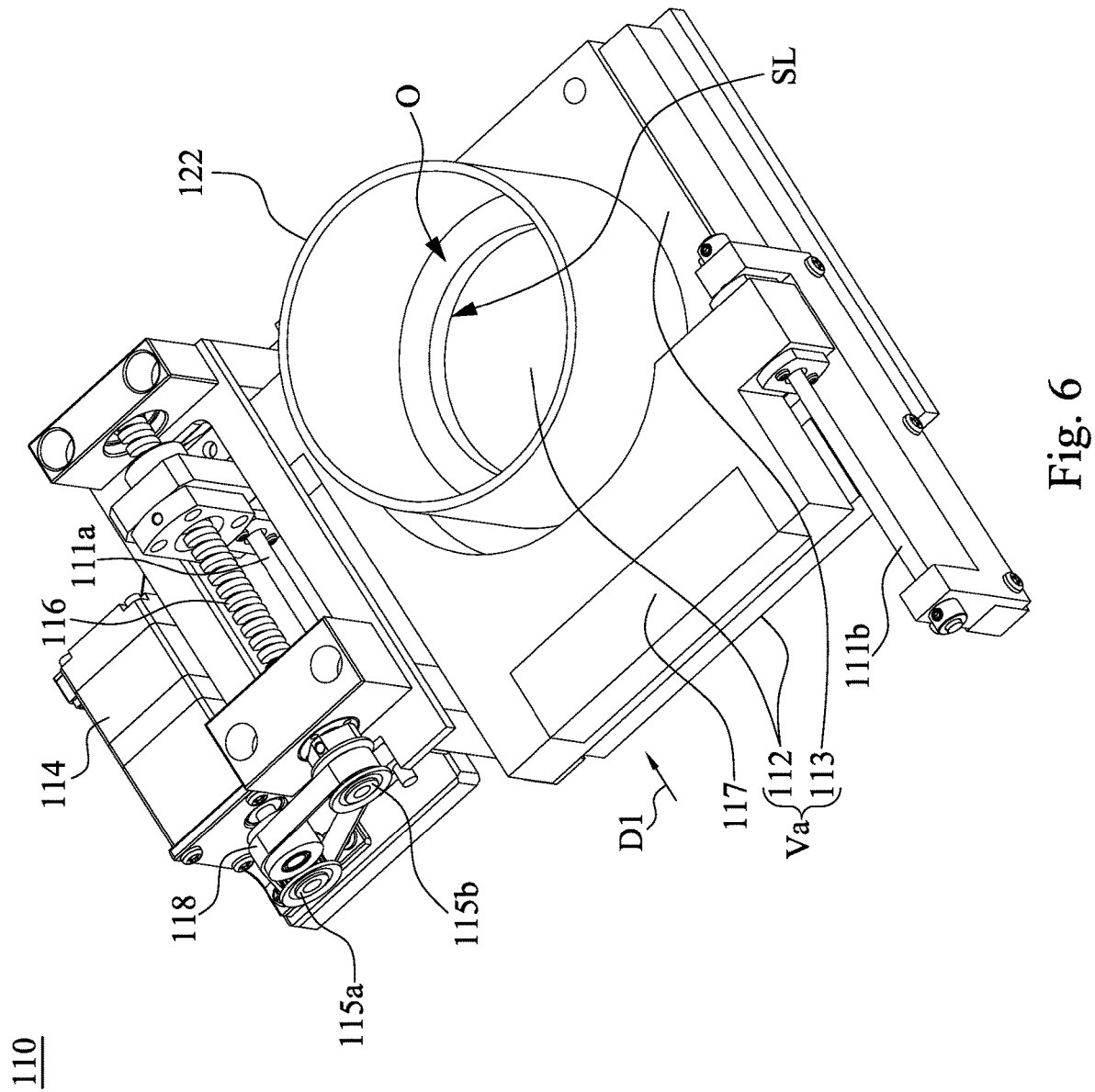
FIG. 6 is a perspective view of the exhaust assembly of FIG. 5.

FIG. 6 is a perspective view of the exhaust assembly 110 of FIG. 5. The exhaust assembly 110 is connected to the tank 124 and includes a valve Va. The exhaust pipe 122 is connected to the tank 124 (see FIG. 5). The valve Va is connected to the exhaust pipe 122. In some embodiments, the exhausting parameter value determined by the CIM system 130 of FIG. 2 includes an opening degree of the valve Va. The opening degree of the valve Va is determined based on the measured chemical concentration. The controller C of FIG. 3A is configured to control the opening degree of the valve Va based on the exhausting parameter value. In some alternative embodiments, the controller C of FIG. 3A may be configured to directly determine the exhausting parameter value (e.g. the opening degree of the valve Va) and use the exhausting parameter value to control the valve Va. The valve Va includes a valve body 113 and a gate 112. The valve body 113 is mounted on the tank 124 and is connected to the exhaust pipe 122. The gate 112 is movably contained in the valve body 113 and is below the opening O of exhaust pipe 122. Moreover, the exhaust assembly 110 further includes a motor 114 and a ball screw 116, and the ball screw 116 is connected to the gate 112 and the motor 114. The motor 114 is electrically connected to the CIM system 130 of FIG. 2 and the semiconductor apparatus 120 of FIG. 3A to receive and send information. When the motor 114 rotates its shaft in a direction, the ball screw 116 connected to the motor 114 may rotate at the same time. The gate 112 connected to the ball screw 116 can be moved below the opening O of the exhaust pipe 122 to close, open, or partially open the opening O of exhaust pipe 122 (see FIGS. 6, 8, and 10). In other words, the area of the opening O of exhaust pipe 122 may vary through moving the gate 112. The position of the gate 112 is controlled based on the measured chemical concentration. As a result, the exhaust assembly 110 can control the vapor flux through the exhaust pipe 122 by controlling the area of the opening O of the exhaust pipe 122.

Reference is made to FIGS. 5 and 6. When the measured chemical concentration is higher than a control upper limit value, the area of the opening O of the exhaust pipe 122 can be decreased through moving the gate 112. In some embodiments, the gate 112 is moved in a direction D1 to decrease the area of the opening O of the exhaust pipe 122. In other words, the opening degree of the valve Va connected to the exhaust pipe 122 is decreased. In some embodiments, as shown in FIG. 6, the gate 112 may be moved to close the opening O of the exhaust pipe 122. As a result, the vapor V of FIG. 5 may be retained in the tank 124, such that the chemical concentration in the electrolyte S is not continuously increased for the reason of solvent evaporation from the electrolyte S.

In some embodiments, the valve body 113 is disposed at an end of the exhaust pipe 122. The end of the exhaust pipe 122 is sleeved by the valve body 113, and the gate 112 is accommodated by the valve body 113. The valve body 113 has a slit SL, and the gate 122 is movably received in the slit SL.

Moreover, the exhaust assembly 110 further includes gear wheels 115a and 115b and a belt 118. The gear wheels 115a and 115b are respectively coupled to the shaft of the motor 114 and an end of the ball screw 116. The belt 118 is sleeved on the gear wheels 115a and 115b, such that the ball screw 116 can be rotated by rotation of the shaft of the motor 114. In addition, the exhaust assembly 110 further includes a connector 117 and linear guides 111a and 111b. The connector 117 is connected to a side of the gate 112. Two sides of the connector 117 are respectively coupled to the linear guides 111a and 111b, and one of the two sides of the connector 117 is also connected to the ball screw 116. In such a configuration, when the ball screw 116 is rotated, the connector 117 can move along the linear guides 111a and 111b to enable the gate 112 to move into or outward from the opening O of the exhaust pipe 122.

In some embodiments, the opening degree of the valve Va is from about 0% to about 100%. When the opening degree of the valve Va is about 0%, substantially the entire opening O of the exhaust pipe 122 is closed by the gate 112. When the opening degree of the valve Va is about 100%, substantially no portion of the gate 112 is in the opening O of the exhaust pipe 122. In some embodiments, an inner diameter of the exhaust pipe 122 is in a range from about 2 cm to about 2 m. When the inner diameter of the exhaust pipe 122 is greater than about 2 m, the cost of the exhaust assembly 110 is expensive, and the slit SL is too large to easily control. When the inner diameter of the exhaust pipe 122 is less than about 2 cm, the efficiency of the exhaust assembly 110 is bad and thus the desired effect of controlling the chemical concentration in the electrolyte S is difficultly achieved.

Figure 7:
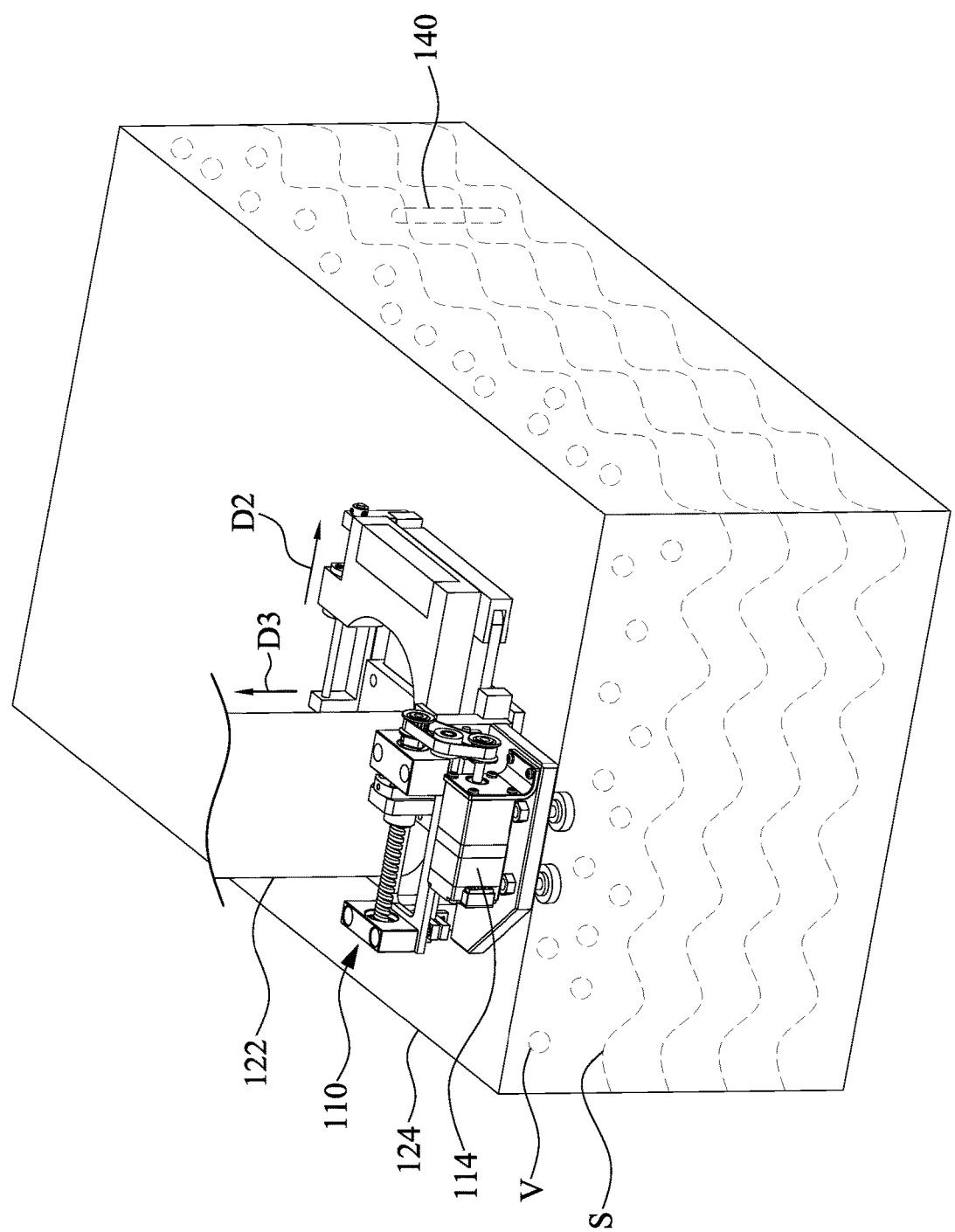
FIG. 7 is a perspective view of the exhaust assembly and the tank of FIG. 3A, in which the exhaust assembly is in an open state.

FIG. 7 is a perspective view of the exhaust assembly 110 and the tank 124 of FIG. 3A, in which the exhaust assembly 110 is in an open state. The open state means the opening O of the exhaust pipe 122 (see FIG. 8) is opened by the exhaust assembly 110.

Figure 8:
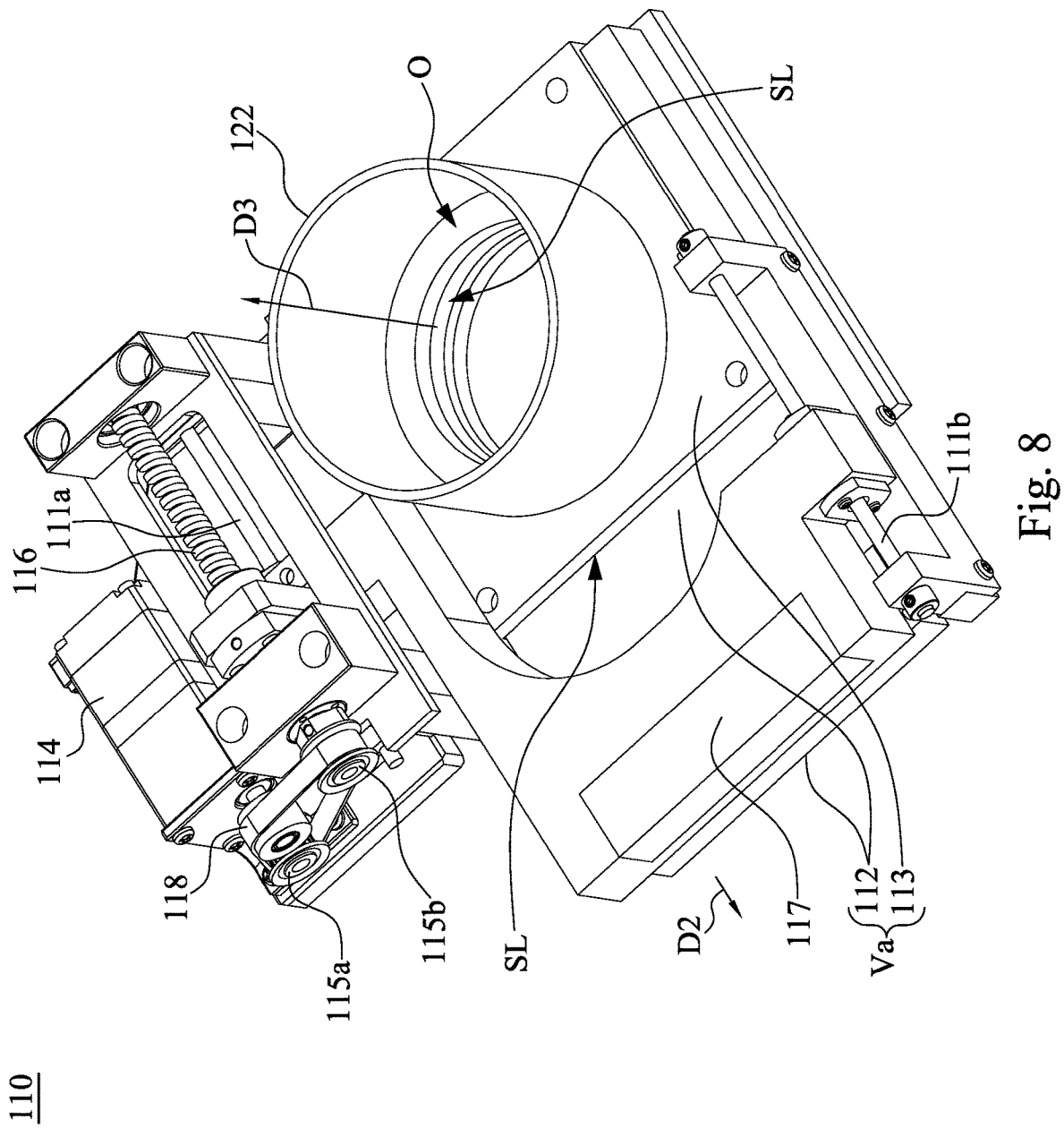
FIG. 8 is a perspective view of the exhaust assembly of FIG. 7.

FIG. 8 is a perspective view of the exhaust assembly 110 of FIG. 7. When the measured chemical concentration is lower than a control lower limit value, the area of the opening O of the exhaust pipe 122 can be increased through moving the gate 112. In some embodiments, the gate 112 is moved in a direction D2 to increase the area of the opening O of the exhaust pipe 122. In other words, the opening degree of the valve Va connected to the exhaust pipe 122 is increased. As shown in FIG. 8, the opening O of the exhaust pipe 122 is opened through moving the gate 112. As a result, the vapor V of FIG. 7 moves into the exhaust pipe 122 in a direction D3 from the tank 124, and the speed of solvent evaporation from the electrolyte S is accelerated, such that the chemical concentration in the electrolyte S increases. FIG. 8 shows the opening O of exhaust pipe 122 is completely opened through moving the gate 112 of the exhaust assembly 110.

Figure 9:
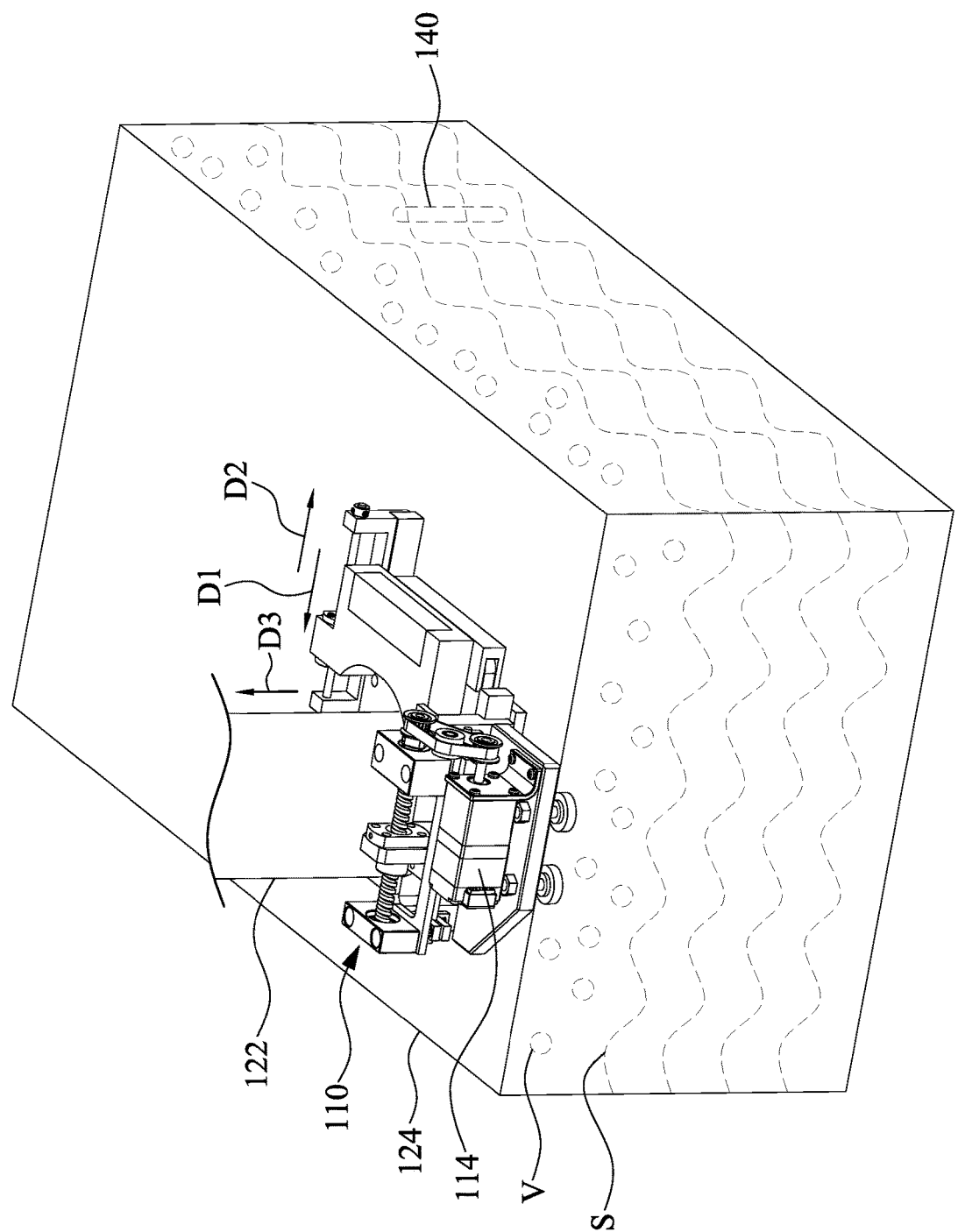
FIG. 9 is a perspective view of the exhaust assembly and the tank of FIG. 3A, in which the exhaust assembly is in a partially-open state.
Figure 10:
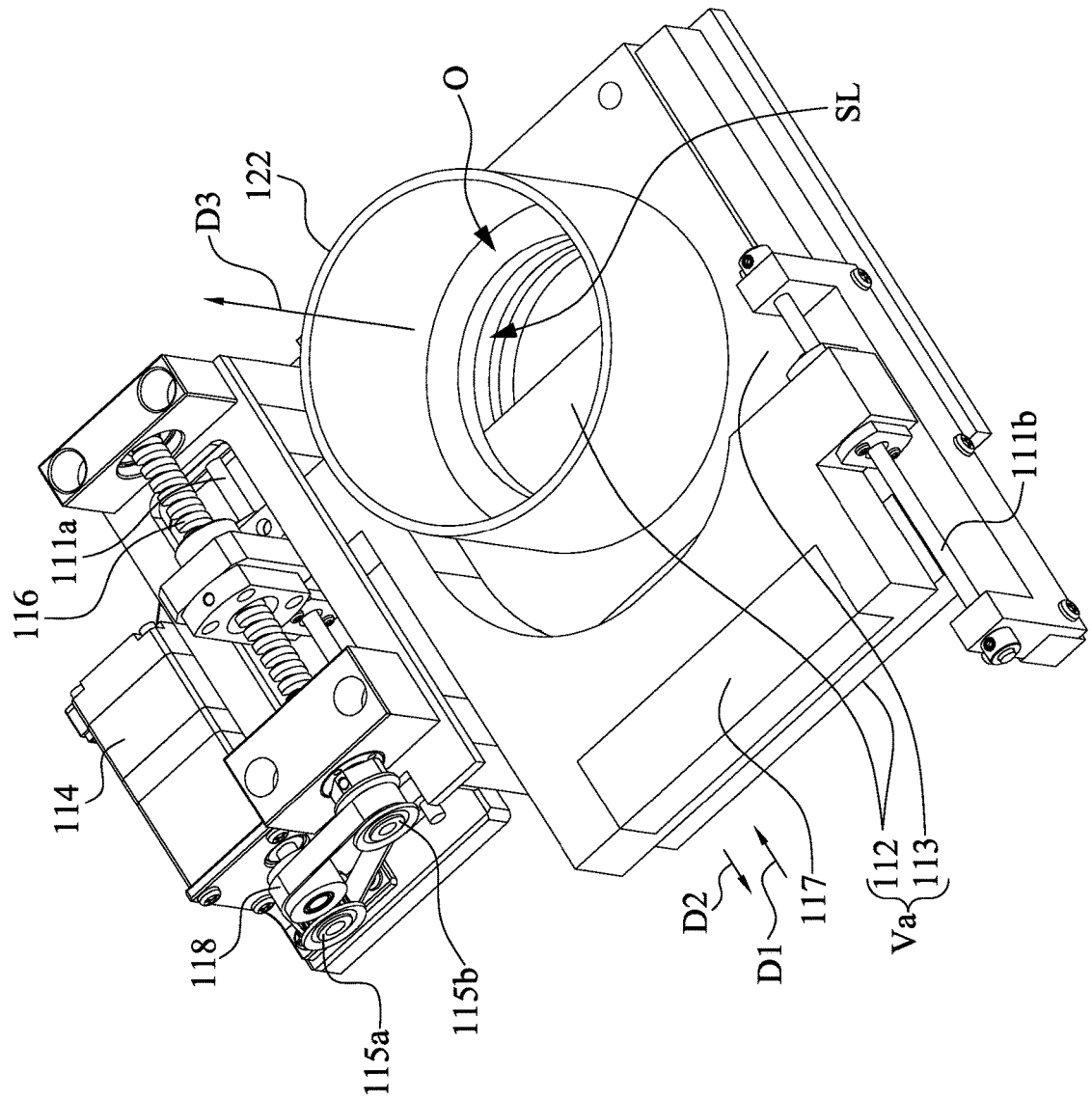
FIG. 10 is a perspective view of the exhaust assembly of FIG. 9.

FIG. 9 is a perspective view of the exhaust assembly 110 and the tank 124 of FIG. 3A, in which the exhaust assembly 110 is in a partially-open state. FIG. 10 is a perspective view of the exhaust assembly 110 of FIG. 9. When the measured chemical concentration is between the control upper limit value and the control lower limit value, the exhaust assembly 110 is in the partially-open state. In some embodiments, the gate 112 is moved in a direction D1 or D2 to close or open a portion of the opening O of the exhaust pipe 122. As shown in FIG. 10, the opening O is partially opened or closed through moving the gate 112. When the exhaust assembly 110 is in the partially-open state, the chemical concentration in the electrolyte S may mildly increase or decrease. The chemical concentration in the electrolyte S can be tuned through adjusting the opening degree of the valve Va.

Figure 11:
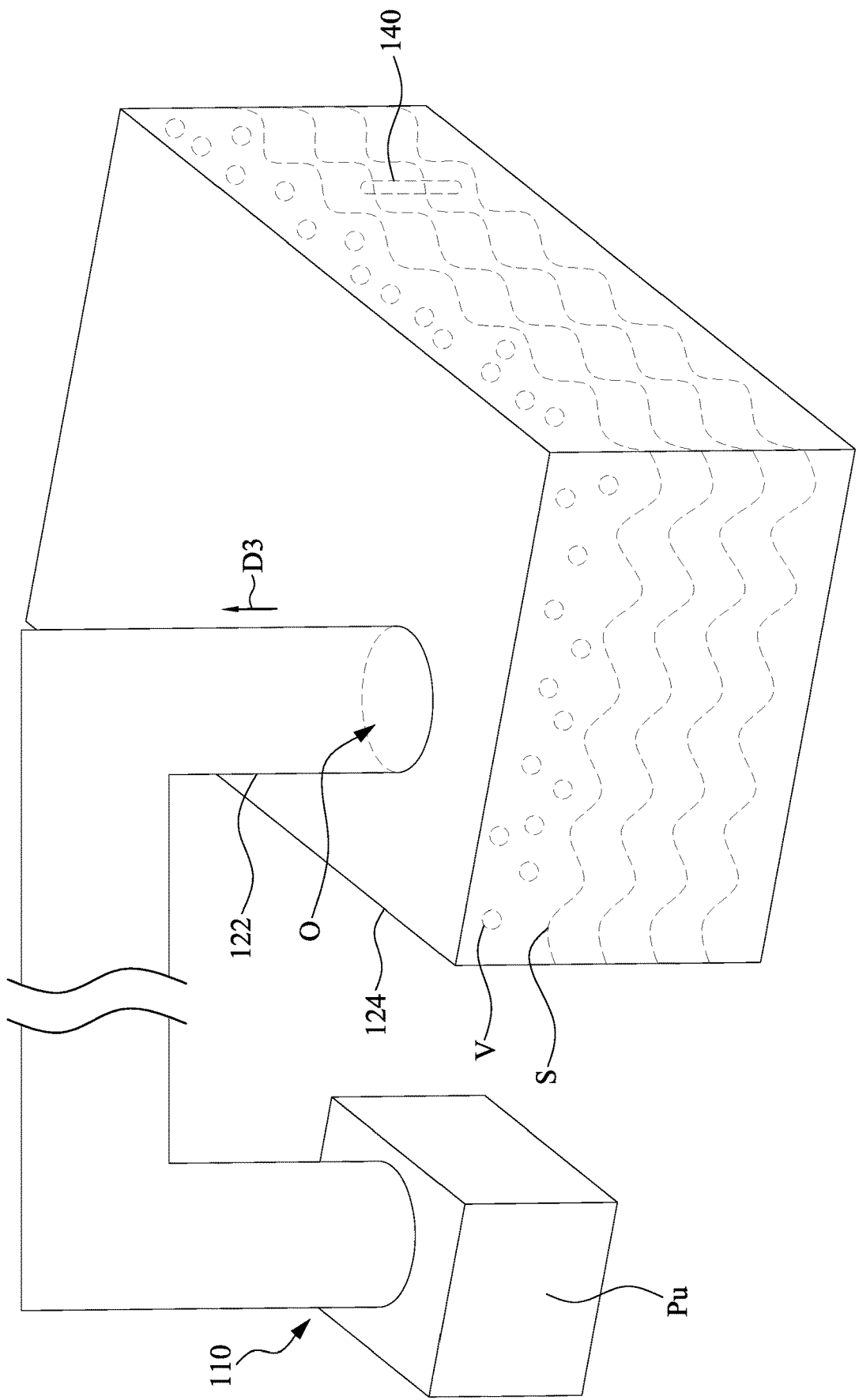
FIG. 11 is a perspective view of an exhaust assembly and a tank in accordance with some embodiments of the present disclosure.

FIG. 11 is a perspective view of the exhaust assembly 110 and the tank 124 in accordance with some embodiments of the present disclosure. The embodiment in FIG. 11 can be implemented in addition to the embodiments shown in FIGS. 6-10. In some embodiments, the exhaust assembly 110 includes an exhaust source Pu. The exhaust source Pu is connected to the exhaust pipe 122. In some embodiments, the exhausting parameter value determined by the CIM system 130 of FIG. 2 includes a pumping rate of the exhaust source Pu. The pumping rate of the exhaust source Pu is determined based on the measured chemical concentration. The controller C of FIG. 3A is configured to control the pumping rate of the exhaust source Pu based on the exhausting parameter value. In some alternative embodiments, the controller C of FIG. 3A may be configured to directly determine the exhausting parameter value (e.g. the pumping rate of the exhaust source Pu) and use the exhausting parameter value to control the exhaust source Pu.

When the measured chemical concentration is higher than a control upper limit value, the pumping rate of the exhaust source Pu can be decreased to retain the vapor in the tank 124. As a result, the chemical concentration in the electrolyte S will not be continuously increased for the reason of solvent evaporation from the electrolyte S. On the other hand, when the measured chemical concentration is lower than a control lower limit value, the pumping rate of the exhaust source Pu can be increased to increase the rate of piping the vapor out of the tank 124 and to lower the pressure in the tank 124. As a result, the rate of solvent evaporation from the electrolyte S is accelerated so as to increase the chemical concentration in the electrolyte S.

In some embodiments, the exhaust assembly 110 controls the vapor flux through the exhaust pipe 122 to be in a range from about 10 m$^3$/hr to about 5000 m$^3$/hr. If the vapor flux through the exhaust pipe 122 is smaller than about 10 m$^3$/hr, the efficiency of the exhaust assembly 110 is bad and thus the desired effect of controlling the chemical concentration in the electrolyte S is difficultly achieved. If the vapor flux through the exhaust pipe 122 is greater than about 5000 m$^3$/hr, the chemical concentration in the electrolyte S is difficultly controlled.

In some embodiments, the exhaust assembly is configured to increase or decrease a vapor flux through the exhaust pipe based on the measured chemical concentration. When the measured chemical concentration is too low, the vapor flux through the exhaust pipe is increased to increase the chemical concentration in the electrolyte. When the measured chemical concentration is high enough or too high, the vapor flux through the exhaust pipe is decreased to decrease the chemical concentration in the electrolyte.

According to some embodiments, a method of controlling chemical concentration in electrolyte includes measuring a chemical concentration in an electrolyte, wherein the electrolyte is contained in a tank; and increasing a vapor flux through an exhaust pipe connected to the tank when the measured chemical concentration is lower than a control lower limit value.

According to some embodiments, a method of controlling chemical concentration in electrolyte includes electroplating a wafer using an electrolyte, recycling the electrolyte to a tank, measuring a chemical concentration in the electrolyte, determining an exhausting parameter value based on the measured chemical concentration, and evacuating a vapor in the tank using the determined exhausting parameter value.

According to some embodiments, a semiconductor apparatus includes a tank, an exhaust assembly, a prober, and a controller. The tank is configured to contain an electrolyte. The exhaust assembly is connected to the tank. The prober is configured to measure a chemical concentration in the electrolyte. The controller is configured to control the exhaust assembly based on the measured chemical concentration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    electroplating, using an electrolyte, wafers respectively in a plurality of electroplating cells;
    recycling the electrolyte to a tank that is connected to the electroplating cells, wherein the tank is external to the electroplating cells;
    measuring a chemical concentration in the electrolyte in the tank;
    controlling, using a valve over a top of the tank, a vapor flux through an exhaust pipe connected to the tank, wherein the valve comprises a gate below a bottom end of the exhaust pipe, and controlling the vapor flux through the exhaust pipe comprises:
        rotating a ball screw connected to the gate, wherein the ball screw extends along the top of the tank; and
        rotating a shaft of a motor connected to the ball screw, wherein the motor laterally overlaps the ball screw, and the ball screw is between the motor and the exhaust pipe; and
    increasing the vapor flux when the measured chemical concentration is lower than a control lower limit value.

2. The method of claim 1, further comprising:
    decreasing the vapor flux through the exhaust pipe when the measured chemical concentration is higher than a control upper limit value.

3. The method of claim 2, wherein decreasing the vapor flux through the exhaust pipe comprises:
    decreasing an opening degree of the valve, wherein the valve is connected to the exhaust pipe.

4. The method of claim 1, wherein increasing the vapor flux comprises:
    increasing an opening degree of the valve, wherein the valve is connected to the exhaust pipe.

5. The method of claim 1, wherein controlling the vapor flux through the exhaust pipe comprises moving the gate along the top of the tank.

6. The method of claim 1, wherein the gate is over and vertically overlaps the top of the tank.

7. A method comprising:
electroplating a wafer using an electrolyte;
rinsing the wafer by spraying water to the wafer through a nozzle after electroplating the wafer in such a manner that the water falls into the electrolyte after rinsing the wafer;
recycling the electrolyte to a tank connected to an exhaust pipe;
measuring a chemical concentration in the electrolyte;
determining an exhausting parameter value based on the measured chemical concentration; and
evacuating a vapor in the tank using the determined exhausting parameter value, comprising:
rotating a ball screw connected to a gate below a bottom end of the exhaust pipe, wherein the ball screw extends along a top of the tank; and
rotating a shaft of a motor connected to the ball screw, wherein the motor laterally overlaps the ball screw, and the ball screw is between the motor and the exhaust pipe.

8. The method of claim 7, wherein determining the exhausting parameter value comprises:
determining an opening degree of a valve, wherein the valve is connected to the exhaust pipe, and the exhaust pipe is connected to the tank.

9. The method of claim 7, wherein evacuating the vapor is performed such that the chemical concentration is sustained in a range from 97% to 103% of a target value.

10. A method, comprising:
electroplating a wafer using an electrolyte;
recycling the electrolyte to a tank connected to an exhaust pipe;
measuring a chemical concentration in the electrolyte;
determining an opening degree of a valve based on the measured chemical concentration, wherein the valve is directly above the electrolyte and comprises a gate below a bottom end of the exhaust pipe and having a bottom surface above and vertically overlapping a top surface of the electrolyte in the tank; and
evacuating a vapor above the electrolyte and in the tank using the determined opening degree of the valve, comprising:
rotating a ball screw connected to the gate, wherein the ball screw extends along a top of the tank; and
rotating a shaft of a motor connected to the ball screw, wherein the motor laterally overlaps the ball screw, and the ball screw is between the motor and the exhaust pipe.

11. The method of claim 10, wherein determining the opening degree of the valve further comprises:
when the measured chemical concentration is lower than a control lower limit value, increasing the opening degree of the valve.

12. The method of claim 11, wherein determining the opening degree of the valve further comprises:
when the measured chemical concentration is higher than a control upper limit value, decreasing the opening degree of the valve.

13. The method of claim 11, further comprising:
moving the gate of the valve to reach the determined opening degree of the valve by the motor and the ball screw connected to the gate and the motor.

14. The method of claim 11, wherein evacuating the vapor above the electrolyte and in the tank comprises:
evacuating the vapor from a top of the tank.

15. The method of claim 10, further comprising:
after determining the opening degree of the valve, moving the gate of the valve along a top of the tank to reach the determined opening degree of the valve.

16. The method of claim 10, wherein the bottom surface of the gate directly faces the top surface of the electrolyte in the tank.

* * * * *